(12) United States Patent
Dorogy et al.

(10) Patent No.: US 7,569,331 B2
(45) Date of Patent: Aug. 4, 2009

(54) CONDUCTIVE PATTERNING

(75) Inventors: William Dorogy, Newburyport, MA (US); Sterling Chaffins, Corvallis, OR (US); Michael J Day, Corvallis, OR (US); John A deVos, Corvallis, OR (US); Makarand P. Gore, Corvallis, OR (US); Andrew L. Van Brocklin, Corvallis, OR (US); Douglas R. Houck, Corvallis, OR (US); David M. Kwasny, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 486 days.

(21) Appl. No.: 11/142,699

(22) Filed: Jun. 1, 2005

(65) Prior Publication Data

US 2006/0275705 A1 Dec. 7, 2006

(51) Int. Cl.
*G03F 7/26* (2006.01)
(52) U.S. Cl. ............... 430/311; 430/945; 430/348; 430/964; 430/616; 430/320; 430/322
(58) Field of Classification Search ............... 430/311, 430/348, 616, 964, 270.1, 322, 945, 320
See application file for complete search history.

(56) References Cited

U.S. PATENT DOCUMENTS 5,175,399 A 12/1992 Mori et al.
6,524,663 B1 2/2003 Kelly et al.
6,696,173 B1 2/2004 Naundorf et al.
6,730,857 B2 5/2004 Konrad et al.
6,740,821 B1 5/2004 Jiang et al.
6,921,626 B2 * 7/2005 Ray et al. ............... 430/311
2001/0048979 A1 12/2001 Ohmi et al.
2002/0015907 A1 * 2/2002 Wolk et al. ............... 430/200
2002/0129972 A1 9/2002 Konrad et al.
2003/0015962 A1 * 1/2003 Murasko et al. ............ 313/509
2003/0146019 A1 8/2003 Hirai
2003/0180448 A1 9/2003 Brook-Levinson et al.
2004/0001914 A1 1/2004 Lee
2004/0058521 A1 3/2004 Brist et al.
2004/0062896 A1 4/2004 Picone et al.
2004/0191423 A1 9/2004 Ruan et al.
2005/0069688 A1 3/2005 Kliesch et al.

FOREIGN PATENT DOCUMENTS

EP 0340997 11/1989

OTHER PUBLICATIONS

International Search Report and Written Opinion of the International Searching Authority dated Sep. 25, 2006.
Joshua Walker, What You Need To Know About RFID in 2004, World Trade Magazine, Mar. 1, 2004 (5 pgs.).
Anonymous, Chapter 15: Radio Tags and Transponders, ACFR Publications, Australian Centre for Field Robotics, University of Sydney, ACFR Teaching MECH 4720, acfr.usyd.edu.au/teaching/4th-year/.../material/lecture_notes (10 pgs.).

(Continued)

*Primary Examiner*—Mark F Huff
*Assistant Examiner*—Caleen O Sullivan

(57) ABSTRACT

Various embodiments of a method, coating and system for conductive patterning are disclosed.

22 Claims, 5 Drawing Sheets

OTHER PUBLICATIONS

Roy Want/Intel Research, Enabling Ubiquitous Sensing with RFID, Invisible Computing, Apr. 2004, pp. 84-86 (3 pgs.), anonymous.
Transponder Coils in an RFID System, Coilcraft, Inc., Document 397, revised Apr. 6, 2004 (1 pg.).
Anonymous, Tutorial Overview Of Inductively Coupled RFID Systems, UPM Rafsec 2002-2004, May 2003 (7 pgs.).
D. Redinger, Steve Molesa, Shong Yin Rouin Farschi and Vivek Subramanian, An Ink-Jet-Deposited Passive Component Process for RFID, IEEE Transactions on Electron Devices, vol. 51, No. 12, Dec. 2004, pp. 1978-1983 (6 pgs.).

\* cited by examiner

CONDUCTIVE PATTERNING

BACKGROUND

Many electronic devices may include patterns of electrically conductive material. The patterning of such electrically conductive material may be complex and time consuming or may require expensive equipment.

DETAILED DESCRIPTION OF EXAMPLE EMBODIMENTS

Figure 1:
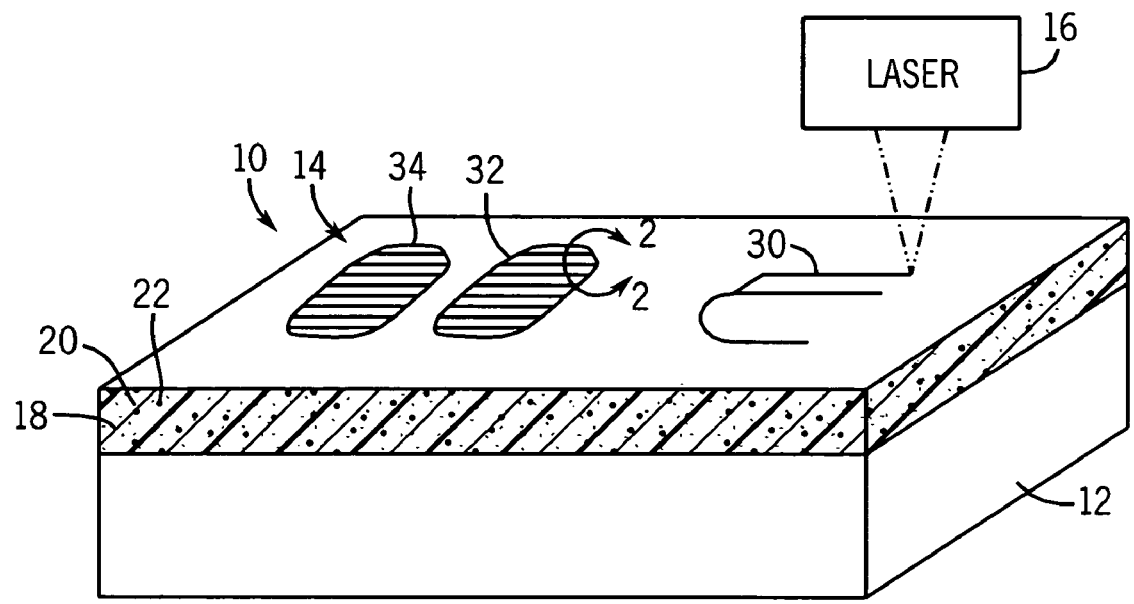
FIG. 1 is a top perspective view schematically illustrating conductive patterning of a coating according to one example embodiment.

FIG. 1 is a fragmentary sectional view schematically illustrating one example of a blank 10 which generally includes substrate 12 and coating 14. Substrate 12 comprises one or more layers of one or more materials configured to support coating 14. In one embodiment, substrate 12 may comprise a polymer. In other embodiments, substrate 12 may be formed from non-polymeric materials. Substrate 12 may be non-flexible, such as circuit board, or flexible such as a film or textile fabric.

Coating 14 comprises a solidified layer supported by substrate 12. Coating 14 is generally non-conductive. For purposes of this disclose term "non-conductive" means that the coating has a sheet resistivity of at least about 1.0 E+10 ohms/square or alternatively a bulk resistivity of at least about 3.0 E+6 ($3\times10^6$) ohm-cm per square. Coating 14 is configured to be induced to an electrically conductive state upon being irradiated by a laser 16 (schematically shown). For purposes of this disclosure, the term "electrically conductive" shall mean that coating 14 has a sheet resistivity of less than or equal to about 10 ohms/square or alternatively a bulk resistivity of less than or equal to about 3.0 E−3($3\times10^{-3}$) ohm-cm per square. In the particular example illustrated, coating 14 is configured to change from a non-conductive state to a conductive state in response to being irradiated by a laser 16 having a power of less than or equal to about 50 milliwatts. In one embodiment, coating 14 is configured to change from a non-conductive state to a conductive state in response to being irradiated by a laser beam emitted by laser 16 and having a wavelength of less than about 800 nanometers.

Coating 14 generally includes binder 18, conductive elements 20 and laser radiation absorption propagation material 22. Binder 18 comprises a material configured to bind or join conductive elements 20 and absorption propagation material 22. According to one embodiment, binder 18 comprises a thermoplastic polymer or a resin such as poly(urethane ethers). In other embodiments, binder 18 may comprise other materials such as polyolefin thermoplastics, polyethers including thermoplastics and thermoplastic elastomers, polyurethanes and other thermoplastics or thermoplastic elastomers. In the example shown, the binder is thermally ablatable with a low char ratio (i.e., most of decomposition occurs as volatile gases).

Conductive elements 20 are disbursed throughout binder 18 and are configured to conduct electrical charge upon coating 14 being irradiated by laser 16. In one embodiment, conductive elements 20 are provided as part of metal salts, such as chelates disbursed throughout binder 18. As a result, the inclusion of conductive elements 20 (provided as metal salts also known as a metal complex or coordination complex) render coating 14 non-conductive absent irradiation by laser 16. Examples of metal salts that may be utilized as part of coating 14 include silver hexafluoroacetylacetonate tetraglyme complexes. In other embodiments, other complexes such as volatile ligands such as acetylacetonates and oligo- or polyethers may be employed.

In other embodiments, conductive elements 20 may comprise metallic or conductive particles dispersed throughout binder 18 having one or more of various shapes or geometries such as spheres (3D), plates (2D) or rods (1D). In such an embodiment, conductive elements 20 (provided as metallic nano particles) and binder 18, together, may alone be electrically conductive. However, in such an embodiment, coating 14 additionally includes material 22 and/or other materials to a sufficient extent such that coating 14 is electrically non-conductive. In one embodiment, conductive elements 20 may comprise metallic nano particles such as gold nano particles, silver nano particles, copper nano particles or other metal particles.

Laser radiation absorption propagation material 22 comprises a material disbursed throughout binder 18 configured to propagate or enhance absorption of radiation by coating 14 that is emitted from laser 16. In one embodiment, material 22 is configured to enhance absorption of a predefined range of wavelengths of electromagnetic radiation that corresponds to the wavelengths of electromagnetic radiation emitted by laser 16. In other words, material 22 may be specifically configured to enhance absorption of the specific range of wavelengths emitted by laser 16. It is believed that because material 22 propagates the absorption of radiation, coating 14 absorbs radiation at a faster rate compared to coating 14 without material 22, causing those portions of coating 14 irradiated by laser 16 to also heat at a faster rate. Heating of portions of coating 14 cause such portions to convert to a conductive state. Although the above process is believed to be the mechanism by which non-conductive portions are made conductive in response to being irradiated, other mechanisms may also be taking place. The present disclosure is not to be limited to the described mechanism.

In addition, because material 22 enhances or propagates absorption of radiation from laser 16, sufficient heating of coating 14 to convert coating 14 to a conductive state may be achieved with a relatively low powered laser 16. For example, in one embodiment, material 22 is configured to propagate the absorption of radiation such that laser 16 having a power of less than or equal to about 50 milliwatts may be used to convert portions of coating 14 that are irradiated from a non-conductive state to a conductive state. In one embodiment, material 22 is configured to facilitate the absorption of a laser beam having a wavelength of less than or equal to about 800 nanometers, allowing 780 nanometer lasers that are sometimes found in compact disk write devices and digital video disk (DVD) write devices to be utilized. Such low power lasers are relatively inexpensive as compared to higher powered lasers. Examples of laser radiation absorption propagation materials 22 with strong absorptions at 780 nm include Avecia Pro-Jet 800 N.P. commercially available from Avecia, silicon naphthalocyanine, indocyanine green, IR780 iodide commercially available from Aldrich Chemicals and assigned CAS No. 207399-07-3, American Dye Source (ADS) 780 PP laser dye which is assigned CAS No. 206274-50-2, s0322 commercially available from Sew Chemicals and having CAS No. 256520-09-9, and the like.

Coating 14 may be applied to substrate 12 by various methods. In one embodiment, coating 14 is configured to be applied using screen printing. In other embodiments, coating 14 may be applied to substrate 12 by a wide range of techniques such as inkjet printing, electrophotographic printing, dip coating, spin coating or doctor blade techniques. Coating 14 may be applied to cover the entire surface of substrate 12 or only specific patterned areas on substrate 12. Upon being applied to substrate 12, coating 14 may be cured or solidified using various methods. In one embodiment, coating 14 may be air dried to evaporate solvents. In other embodiments, coating 14 may be solidified or cured by exposure to UV radiation.

FIG. 1 further illustrates a method by which electrically conductive portions 30, 32 and 34 may be patterned upon the surface of blank 10. As shown by FIG. 1, once coating 14 has been cured or solidified, laser 16 irradiates portions 30, 32 and 34 of coating 14. In one embodiment, laser 16 applies a laser beam of less than or equal to 50 milliwatts at a wavelength of less than about 800 nanometers. Laser 16 is moved across coating 14 at a speed or rate such that the temperature of coating 14 is elevated sufficiently to convert portions 30, 32 and 34 from a non-conductive state to a conductive state. In one embodiment in which-conductive elements 20 comprise metal salts, laser 16 heats coating 14 to a temperature sufficient to reduce the metal salts to metal particles. Laser 16 further elevates the temperature of coating 14 sufficiently to liquefy binder 18 along portions 30, 32 and 34, allowing the metal particles to move into electrically conducting positions relative to one another or be fused by sintering at high temperatures.

In those embodiments in which conductive elements 20 comprise metallic nano particles, laser 16 heats portions 30, 32 and 34 to temperatures sufficient to burn off, vaporize or decompose material 22 and to liquefy or melt binder 18 along portions 30, 32 and 34, allowing the metal particles to move into sufficient proximity with one another for electrical conduction. In one embodiment, laser 16 may comprise a laser having a power less than or equal to about 50 milliwatts. In one embodiment, laser 16 may be configured to emit a wavelength of less than or equal to 800 nanometers, such as a 780 nanometer laser beam.

As further shown by FIG. 1, laser 16 and/or blank 10 may be precisely moved relative to one another to form an electrically conductive lines or traces 30. Such electrical lines or traces may be used for forming an antenna or for electrically connecting electrical components mounted and connected to blank 10. In addition, laser 16 and/or blank 10 may also be moved relative to one another to form electrically conductive regions 32 and 34 which are spaced from one another but which exhibit electrical conductivity across their areas.

Figure 2:
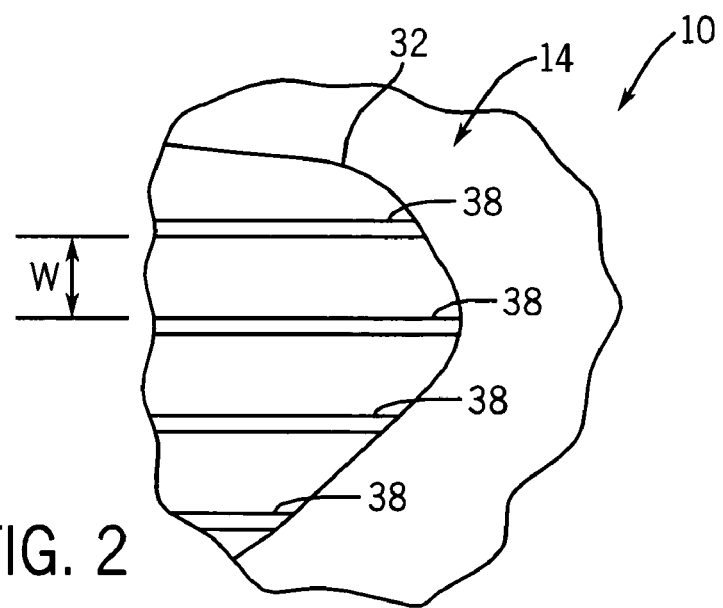
FIG. 2 is an enlarged fragmentary view of the coating of FIG. 1 taken along line 2-2 according to an example embodiment.

FIG. 2 is an enlarged fragmentary view illustrating region 32 in greater detail. As shown by FIG. 2, portion 32 may be formed by rastor scanning laser 16 across coating 14 so as to form a multitude of electrically conductive lines 38 which are spaced from one another by a distance W. Lines 38 are spaced sufficiently close to one another such that portion 32 exhibits electrical conductivity between lines 38. As a result, substantially the entire area of portion 32 is electrically conductive. According to one example embodiment, lines 38 are spaced less than or equal to 25 microns apart from one another. According to one embodiment, lines 38 are spaced from one another by a nominal distance of 18 microns. In other embodiments, lines 38 may be spaced from one another by varying distances.

The following examples are provided by way of illustration and are not intended to limit the scope of the claims. All percentages and parts are by weight unless otherwise noted. The materials shown in Table 1 were used in the examples and were supplied by the supplier shown.

EXAMPLE 1

| Material | Supplier |
|---|---|
| Silver tetraglyme | Silver tetraglyme made according to literature prep (Inorg. Chem. 37, (1998), 549). |
| Alloy: cirrus 715 and m-terphenyl | 715: avicia m-terphenyl: Aldrich (the two are melted together into an alloy) |
| 381-20 (cellulose acetate butyrate) | Eastman |
| Paraloid B60 | Rohm and Haas |
| Ethyl acetate | Aldrich |

The composition of coating 14 is shown in Table 2 below:

| Coating Ingredient | Weight Percent |
|---|---|
| Silver tetraglyme | 47% |
| Alloy: cirrus 715 and m-terphenyl | 3.66% |
| 380-20 | 4.9% |
| Paraloid B60 | 4.9% |
| Ethyl acetate | 39.5% |

The above coating was applied to a polycarbonate disk. The coating was then heated creating a series of colors, continued heating caused the coating to develop a reddish black coloration. The coating was applied to another polycarbonate disk. The dried coating was irradiated with 55 milliwatt laser moving at a linear velocity of 0.1 meters per second having a density of 1000 lines or tracks per inch. Upon being irradiated and heated, the coating attained a silver coloration indicative of a conductive track.

EXAMPLE 2

| Material | Supplier |
|---|---|
| ADS 780 PP Dye | American Dye Source |
| Electrodagpf-007 | Acheson |

The dye was incorporated into the paste by use of a 3-roll mill forcing the paste through an inturning nip of rubber rollers incorporating the dye into the matrix of the paste. Compositions having greater than 8% dye were thinned using butyl carbitol acetate to facilitate screen printing. The compositions were screen printed using a 390 mesh, 45 degree pitch, 2 micron emulsion screen. The substrate comprised either a blank polycarbonate disk or polyethylene terephthalate (PET) film. Films on the disk were dried in a 70° C. oven for at least 30 minutes. Coatings were irradiated with a laser at a height of 0.088 inches over the surface of the coating. The laser comprises a 780 nanometer laser run at 35 milliwatts of power and continuously restored or moved at a speed of 1 inch per second. In other embodiments, the speed may be varied.

Figure 3:
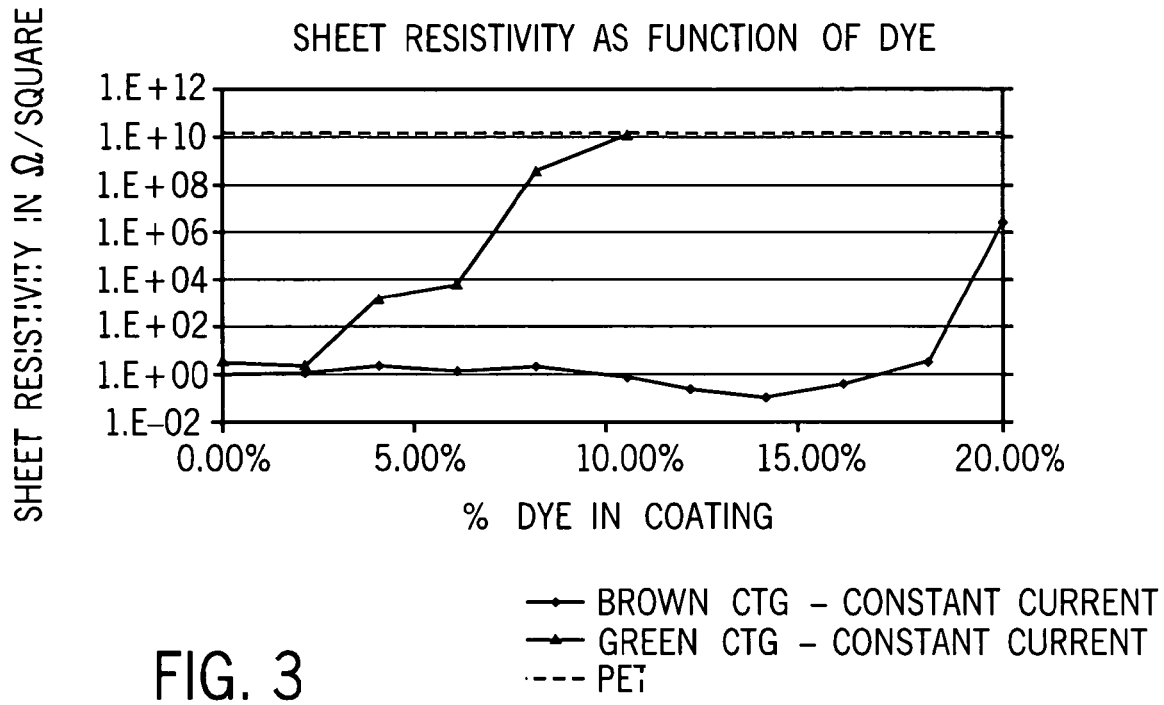
FIG. 3 is a graph illustrating the characteristics of various example coatings according to an example embodiment.

FIG. 3 depicts sheet resistivity as a function of the percent of dye in the coating of Example 2. As indicated in FIG. 2, the Example 2 coating 14 exhibited a decline in conductivity (i.e., an increase in resistivity) beginning with the addition of about 2% of the ADS 780 PP dye. Those portions of coating 14 that were irradiated exhibit a change in color. In the example shown, the coating exhibited a change in color from green to brown. Those coatings having between about 4% dye to about 16% dye are conductive upon being radiated. As shown in FIG. 3, the resistivity of the brown exposed coating is between about 0.1 to 2 ohm/square while the unexposed coating has a resistivity as high as 10 giga-ohm/square. With a thickness of 2.9 microns, the Example 2 coating 14 has a bulk resistivity of about 3 E–5 to 6 E–4 ohm-cm per square after exposure to the laser while the bulk resistivity of coating 14 which has not been exposed to the laser is greater than 3 Mega-ohm-centimeter per square once the dye concentration is between 10% and 18%.

Figure 4:
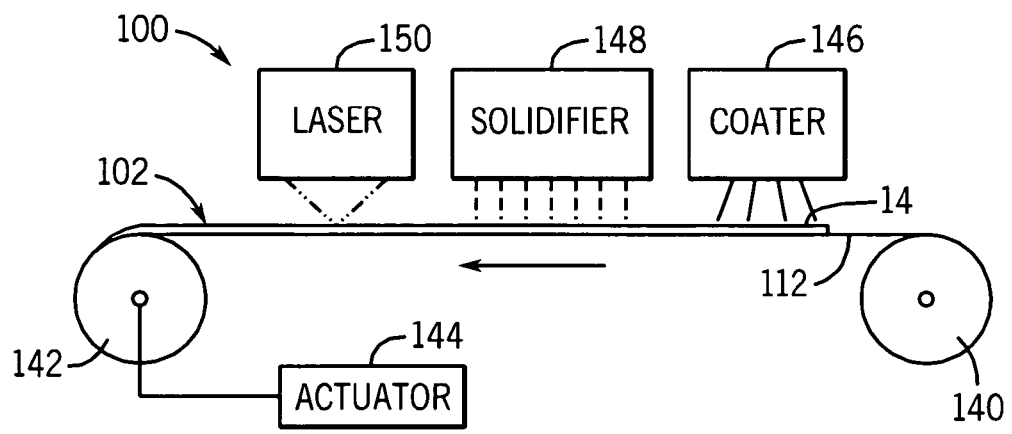
FIG. 4 is a schematic illustration of a patterning system according to an example embodiment.

FIG. 4 schematically illustrates patterning system 100 configured to form a patterned media 112. Patterning system 100 includes feed reel 140, take-up reel 142, actuator 144, coater 146, solidifier 148 and laser 150. Feed reel 140 cooperates with take-up reel 142 to supply a substantially continuous substrate 112. Feed reel 140 supplies substrate 112 prior to interaction with its interaction with coater 146, solidifier 148 and laser 150. Take-up reel 142 winds completed patterned media 102 for further processing, storage or transportation. In the particular example illustrated, substrate 112 comprises a material sufficiently flexible so as to be wound about feed reel 140 and take-up reel 142. In one embodiment, substrate 112 may comprise a sufficiently flexible polymer. In another embodiment, substrate 112 may comprise a fabric, textile or other such material.

Actuator 144 comprises a device configured to rotate take-up reel 142 so as to wind completed patterned media 102 about take-up reel 142. Actuator 144 further rotates take-up reel 142 to move substrate 112 relative to coater 146, solidifier 148 and laser 150. Actuator 144 may comprise a motor and a transmission extending between the motor and take-up reel 142. In addition, the transmission may comprise a series of gears, belts, pulleys, sprockets, chains and the like configured to transmit the rotational force from the motor to take-up reel 142. In other embodiments, actuator 144 may comprise other mechanisms configured to rotatably drive take-up reel 142.

Coater 146 comprises a mechanism configured to deposit coating 14 upon substrate 112. In one embodiment, coater 146 comprises a screen printing device. In other embodiments, coater 146 may be configured to deposit coating upon substrate 112 utilizing other mechanisms such as devices configured to deposit coating 14 by inkjet printing, spray coating, curtain coating or doctor blade coating. In one embodiment, coater 146 is configured to cover an entirety of an entire surface of substrate 112 with coating 14. In another embodiment, coater 146 may be configured to selectively apply or pattern coating 14 to specific areas of the surface of substrate 112.

Solidifier 148 comprises a mechanism configured to solidify coating 14 upon substrate 112. In one embodiment, solidifier 148 may be configured to thermally evaporate the solvent associated with coating 14. In another embodiment, solidifier 148 may be configured to thermally cure coating 14. In still another embodiment, solidifier 148 may be configured to cure coating 14 by applying UV radiation to coating 14. In still other embodiments, solidifier 148 may be configured to supply a catalyst or may be omitted where coating 14 is itself configured to solidify or be cured through chemical cross linking reactions and the like.

Laser 150 comprises a device configured to irradiate coating 14 upon substrate 112 with a laser having an appropriate wavelength and power level such that selected portions of coating 14 are converted from a non-conductive state to an electrically conductive state. In one embodiment, laser 150 is configured to move relative to substrate 112 as it is moving from reel 140 to reel 142. In another embodiment, laser 150 may be generally stationary relative to substrate 112 as it is moving from reel 140 to reel 142. In one embodiment, laser 150 comprises a relatively low power laser with a power of less than 50 milliwatts. In one particular embodiment, laser 150 emits a laser having a wavelength of less than or equal to about 800 nanometers and nominally 780 nanometers. In still other embodiments, laser 150 may comprise other laser devices.

Figure 5:
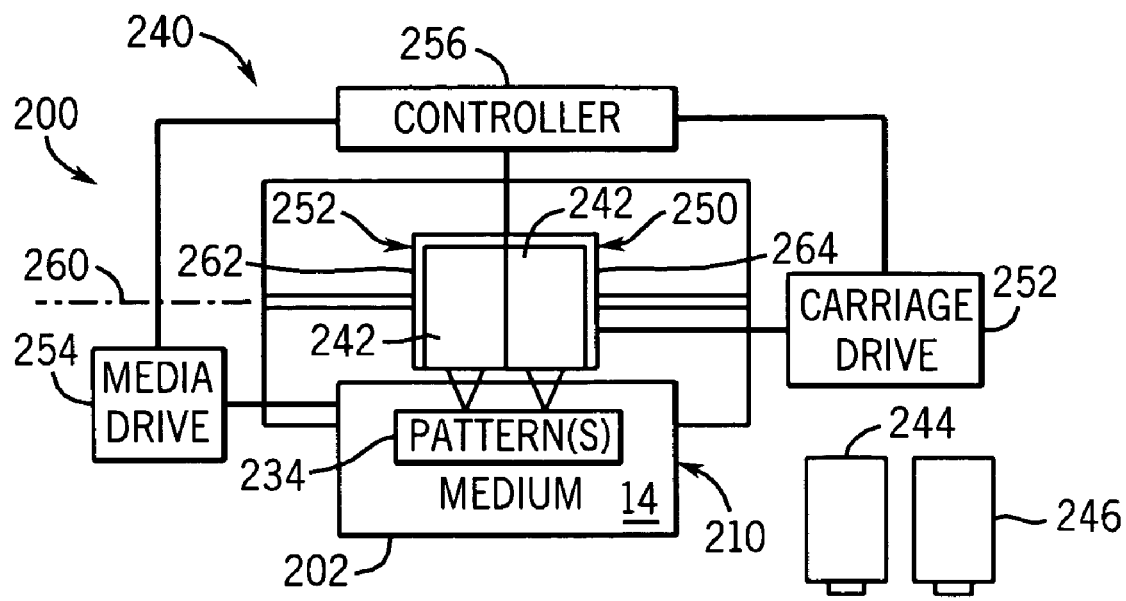
FIG. 5 is a schematic illustration of another embodiment of a patterning system according to an example embodiment.

FIG. 5 schematically illustrates patterning system 200 configured to form patterned media 202 by irradiating selected portions of blank 210 to form one or more electrically conductive patterns 234. Blank 210 is substantially similar to blank 10 shown and described with respect to FIG. 1 except that blank 210 is specifically configured to be moved and fed through system 200. Like blank 10, blank 210 includes an underlying substrate (not shown) and a coating 14 configured to have selected portions converted from a non-conductive state to a conductive state upon being irradiated by system 200. In one particular embodiment, blank 210 comprises a sheet of media having a face with coating 14. In other embodiments, blank 210 may comprise a roll of such media including, coating 14.

Patterning system 200 generally comprises a printer 240, laser modules or cartridges 242, and print cartridge 244, 246. Printer 240 comprises a device configured to print ink or other printing material upon media, such as paper. Printer 240 generally includes carriage 250, carriage drive 252, media drive 254 and controller 256. Carriage 250 generally comprises a structure configured to moved back and forth across blank 210 along a scan axis 260 while supporting at least one laser cartridge 242 or at least one print cartridge 244, 246. In the particular embodiment illustrated, carriage 250 includes cartridge locations 262, 264. Print cartridge locations 262, 264 generally comprise structures along carriage 250 that are configured to releasably or removably hold or retain an individual cartridge. Cartridge locations 262 and 264 are configured so that each of cartridges 242, 244 or 246 may be interchangeable with one another. Carriage 250 may alternatively be configured to specifically support a particular one of cartridges 242, 244 and 246. The exact configuration of cartridge locations 262 and 264 may be varied depending upon the exact configuration of cartridges 242, 244 and 246 to be held or retained at the print cartridge location, as well as the type of connecting or supporting arrangement employed at each print cartridge location 262, 264.

Carriage drive 252 is shown schematically and generally comprises an actuator configured to move carriage 250 along scanned axis 260 across blank 210 in response to control signals from controller 256. Media drive 254, schematically shown, comprises an actuator configured to feed and move blank 210 relative to carriage 250 and whatever cartridges are supported at cartridge locations 262 and 264. The exact configuration of media drive 254 may be varied depending upon the characteristics of blank 210 being fed past carriage 250. For example, media 254 may have different configurations depending upon whether blank 210 is provided as a roll or as individual sheets, and depending upon the particular dimensions of blank 210.

Controller 256 generally comprises a processor unit configured to generate control signals which are transmitted to carriage drive 252, media drive 254 and whatever cartridges 242, 244 or 246 are mounted to carriage 250. Controller 256 may comprise a processing unit configured to execute sequences of instructions contained in a memory (not shown). Execution of the sequences of instructions causes the processing unit to perform steps such as generating control signals. The instructions may be loaded in a random access memory (RAM) for execution by the processing unit from a read-only memory (ROM), mass storage device or some other persistent storage. In other embodiments, hard-wired circuitry may be used in place of or in combination with software instructions to implement the functions described. Controller 256 is not limited to any specific combination of hardware circuitry and software, nor to any particular source for the instructions executed by the processing unit.

Controller 256 receives data representing a pattern or image to be formed upon blank 210 from a source (not shown) such as a computer, a portable memory storage device such as a flash memory, disk, cassette, card and the like, or directly from memory of a device, such as a camera and the like. Controller 256 further senses the characteristics and locations of cartridges 242, 244 and 246 or other cartridges mounted to carriage 250. Based on such information, controller 256 controls carriage 252 to move carriage along axis 260, controls media drive 254 to move blank 210 relative to carriage 250 in directions generally perpendicular to scan axis 260, and controls irradiation of blank 210 by one or both of laser cartridges 242 or the application of ink or other printing material from one or both of print cartridges 244, 246 to blank 210 or to other media.

Figure 6:
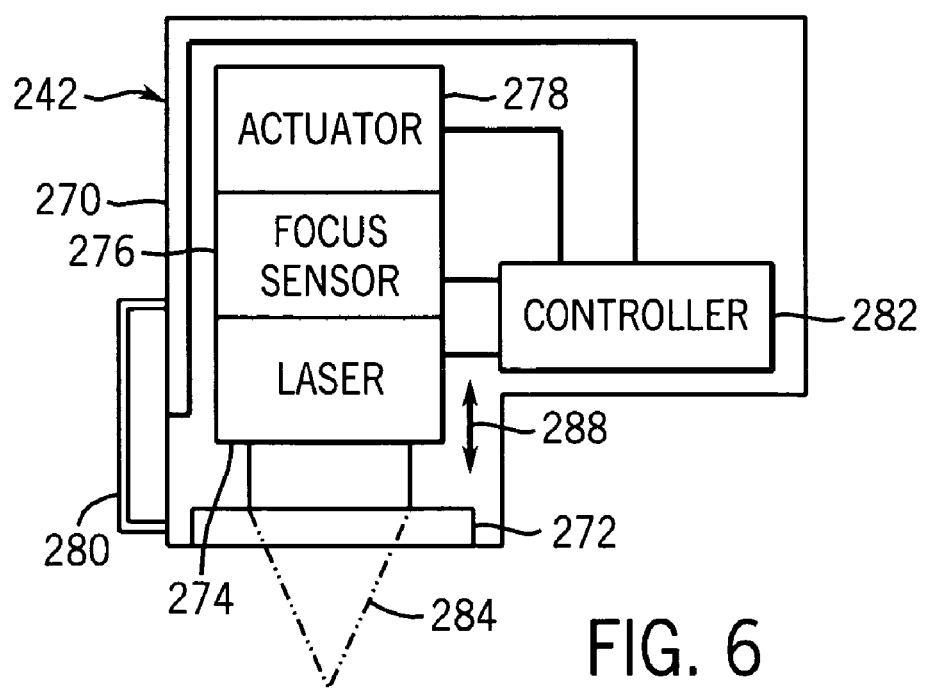
FIG. 6 is a schematic illustration of a laser cartridge of the patterning system of FIG. 5 according to an example embodiment.

Laser cartridges 242 comprise units configured to be removably positioned and mounted to carriage 250 in place of one or both of print cartridges 244, 246. Laser cartridges 242 are configured to irradiate blank 210 with a laser beam in response to control signals from controller 256. FIG. 6 schematically illustrates one example of laser cartridge 242. As shown by FIG. 6, laser cartridge 242 generally includes housing 270, optics 272, laser 274, focus sensor 276, actuator 278, interface 280 and controller 282. Housing 270 comprises the general frame work or outer structure configured to house, support and contain the remaining components of laser cartridge 242. In one embodiment, housing 270 has a substantially similar configuration as that of one or both of print cartridges 244 and 246. Although housing 270 is illustrated as having the particular configuration shown, housing 270 may have other configurations and may be differently configured than that of print cartridges 244 and 246 while being configured to be removably mounted to carriage 250.

Optics 272 comprises one or more optical lenses, mirrors and the like configured to focus a laser beam 284 emitted by laser 274. Laser 274. compromises a device configured to generate and emit a laser beam 284 through optics 272 towards blank 210 (as shown in FIG. 5). In one particular embodiment, laser 274 compromises a laser having a power of less than or equal to about 50 milliwatts. in one embodiment, laser 274 emits a laser bean having a wavelength of less than or equal to about 800 nanometers and nominally about 780 nanometers. According to one embodiment, laser 274 may compromise a NEC 9100A optical pickup unit (OPU) with a 780 nanometer laser configured to deliver 32.9 milliwatts into a 2 micrometer diameter spot. In another embodiment, laser 274 may comprise a sharp GH07P24B1C. configured to deliver 120 milliwatts into a 2 micrometer diameter spot. wavelength, which when combined with optics 272, comprises a single optical element or lens, produces a 20 micrometer diameter focus spot with more than 80 milliwatts of delivered power into the spot.

In the particular example shown, laser 274 is movably coupled to housing 270 so as to be movable in the direction indicated by arrows 288. In such an embodiment, laser 274 may be moved in the direction indicated by arrow 288 to adjust the focus of laser beam 284. In the particular example illustrated, sensor 276 comprises a sensor configured to sense the focus or positioning of laser beam 284 produced by laser 274 while actuator 278 comprises a mechanism configured to actuate or move laser 274 in one of the directions indicated by arrows 288. In one embodiment, actuator 278 may comprise a voice coil motor while sensor 276 comprises a quad focus sensor.

Printer interface 280 comprises an interface configured to facilitate communication between controller 256 of printer 240 and controller 282 of cartridge 242. In one particular embodiment, interface 280 comprises one or more electrically conductive contacts facilitating the transfer of electrical signals from a corresponding interface associated with carriage 250 connected to controller 256. In other embodiments, communication between controller 256 and controller 282 may be facilitated by other communication methods such as by radio signals, optical signals and the like.

Controller 282 comprises a processing unit associated with laser cartridge 242. In one embodiment, controller 282 may comprise an integrated circuit or other processor unit. Controller 282 generates control signals based upon signals received from controller 256 of printer 240 so as to direct the operation of laser 274. In the particular example illustrated, controller 282 further receives signals from sensor 276 and based upon such sign generates control signals directing actuator 278 to appropriately move laser 274 in one of the directions indicated by arrows 288 to appropriately focus laser 274. In other embodiments, controller 282 may merely direct the operation of laser 274. In still other embodiments, controller 282 may be omitted, wherein laser 274 and actuator 278 operate under the direction of signals from controller 256.

Print cartridges 244 and 246 are configured to supply and dispense printing material upon media supplied and moved through printer 240. In one embodiment, print cartridges 244 and 246 are configured to dispense one or more inks. For example, in one embodiment, cartridges 244 and 246 include printheads through which ink is dispensed. Such printheads may comprise piezo electric printheads or thermo resistive printheads. Print cartridges 244 and 246 dispense ink through such printheads in response to control signals from controller 256. In one embodiment, print cartridge 244 supplies a black ink while print cartridge 246 supplies colored inks such as cyan, magenta and yellow or red, green and blue. Although printer 240 is illustrated as including two cartridge locations 262, 264 for removably mounting cartridges 242, 244 and 246, printer 240 may alternatively include a single cartridge location or greater than two such cartridge locations.

In operation, patterning system 200 may be used to print patterns or images of ink upon any of a variety of media such as paper and the like with print cartridges 244 and 246 mounted to carriage 250 at locations 262 and 264, respectively. Should it be desirable to form an electrically conductive pattern on a medium such as upon blank 210 having coating 14, an operator places blank 210 into the tray, slot or other input associated with media drive 254. The operator also removes at least one of print cartridges 244, 246 from carriage 250 and replaces the removed cartridge with at least one of laser cartridges 242. The operator may further input information to controller 256 via keyboard, push button, control panel or the like indicating the connection of laser cartridge 242. Alternatively, printer 240 may be equipped with one or more sensors configured to sense the connection of laser cartridge 242. Thereafter, based upon data received from an external source such as another computer, a portable memory storage device such as a flash memory, disk, cassette, card and the like, controller 256 generates control signals causing media drive 254 to move medium 210 and generates control signals directing carriage drive 252 to move carriage 250 along scan axis 260. In addition, controller 256 further directs one or both of laser cartridges 242 to irradiate blank 210 to form a conductive pattern in coating 14.

In one embodiment, laser cartridges 242 may be mounted to both locations 262 and 264 and both laser cartridges 242 may simultaneously irradiate blank 210 to reduce patterning time. In one embodiment, coating 14 may be configured so as to change color upon being irradiated and upon attaining an electrically conductive state. In other embodiments in which coating 14 does not change color or where such change in color may be difficult to perceive, laser cartridge 242 may be mounted to one of locations 262, 264 while one of print cartridges 244, 246 is mounted to the other of locations 262, 264. In such a scenario, controller 256 may be configured to generate control signals such that the connected print cartridges 244, 246 also deposit and print ink upon coating 14 indicating those portions of coating 14 that have been irradiated and that have been made electrically conductive. For example, in one embodiment, ink may be printed directly over and upon portions of coating 14 that have been irradiated and made electrically conductive. In such an embodiment, because printing upon coating 14 and upon blank 210 is performed while blank 210 is also being irradiated, blank 210 does not need to be re-fed through printer 240. In addition, printing of ink upon blank 210 may be more accurately located with respect to those portions of coating 14 that have been irradiated.

Overall, patterning system 200 facilitates relatively low cost patterning of electrically conductive traces in areas upon blank 210 and further facilitates patterning or imaging of both ink and irradiation upon media. For example, patterning system 200 facilitates the formation of a patterned media 202 using pre-fabricated blanks 210 and further using an existing printer. In some applications, this may enable in-home consumer fabrication of patterned media 202.

Figure 7:
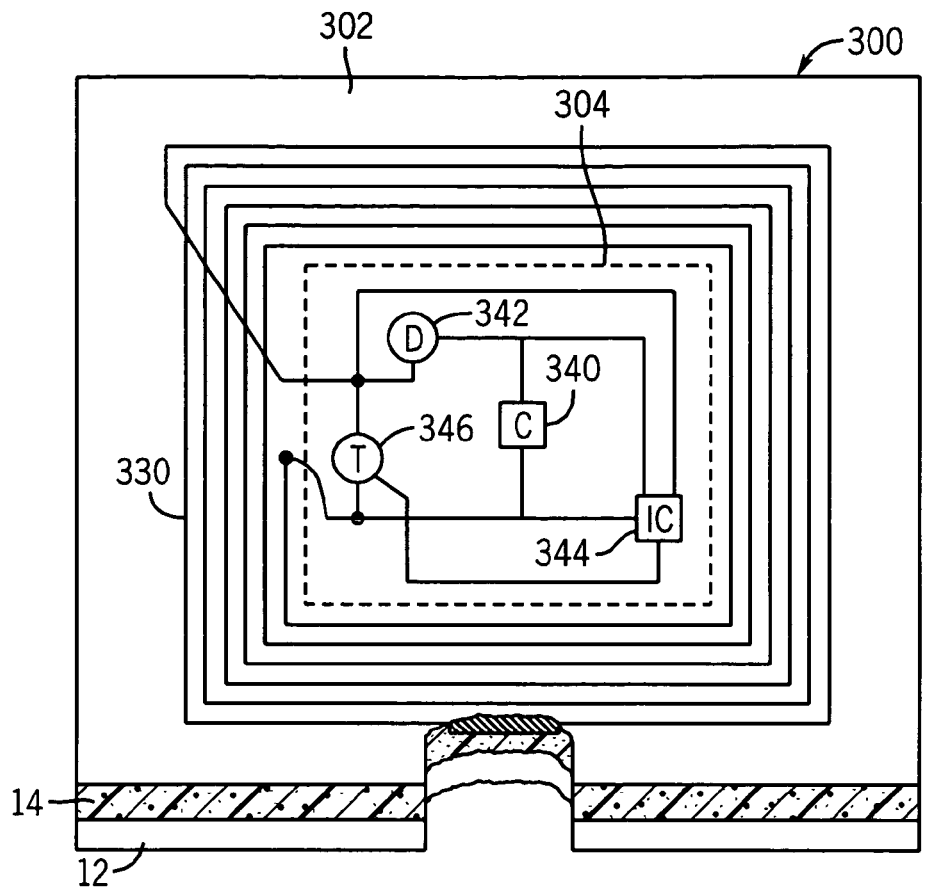
FIG. 7 is a front perspective view of an electronic device including conductive patterning according to an example embodiment.

FIG. 7 illustrates one example of an electronic device 300 including patterned media 302 which may be formed from a media blank such as media blank 10 (shown in FIG. 1) or from another substrate having coating 14. Electronic device 300 comprises a transponder such as a radio frequency identification (RFID) tag which may be used to identify objects such as retail articles in lieu of bar codes and the like. In addition to patterned media 302, electronic device 300 includes communications component 304. Patterned media 302 includes substrate 12 and coating 14. As shown by FIG. 7, coating 14 has been irradiated to form electrically conductive portions 330. In the particular example shown, electrically conductive portions 330 comprise a single continuous electrically conductive line configured to function as an antenna (also known as a transponder coil or coupling element) for electronic device 300. Electrically conductive portions 330 have opposite ends electrically connected to communications component 304. Conductive portions 330, serving as an antenna, enable communications component 304 to communicate with a reader device (not shown). In particular embodiments, electrically conductive portions 330 additionally interact with a magnetic field produced by the reader to induce a current within electrically conductive portion 330 to provide power to communications device 304 or to transmit a charge to communications component 304, awakening communications component 304 for responding to the reader.

Communications component 304 comprises a device configured to respond to a signal from the reader (not shown) to identify the article or object to which electronic device 300 is affixed. In one embodiment, communications component 304 includes capacitor 340, diode 342, integrated circuit 344 and transistor 346. In response to an alternating magnetic field from a reader (not shown), current is induced in the antenna provided by electrically conductive portion 330 which causes a charge to flow into capacitor 340, where it is trapped by diode 342. Upon accumulation of the charge within the capacitor, the voltage across it also increases and activates integrated circuit 344 which transmits an identifier code. The identifier code, comprising high and low levels of a digital signal, results in transistor 346 being turned on and off. This results in electrically conductive portions 330 generating its own varying magnetic field. The variations in the magnetic create variations in current flow in a reader coil which converts the pattern to a digital signal to discern the identifier code assigned to device 300.

In other embodiments, communications component 304 may have other configurations. For example, in other embodiments, communications component 304 may comprise a low-power CMOS integrated circuit containing an analogue RF interface, antenna tuning capacitor RF-to-DC rectifier system, digital control and EEPROM memory and data modulation circuitry. In some embodiments, communications component 304 may additionally include a battery or other power source.

Patterned media 302 including electrically conductive portions 330 may be inexpensively formed with a relatively low power laser irradiating portions of coating 14 to form the antenna of device 300. As a result, fabrication costs of electronic device 300 may be reduced, facilitating more extensive use of device 300 for identifying articles.

Figure 8:
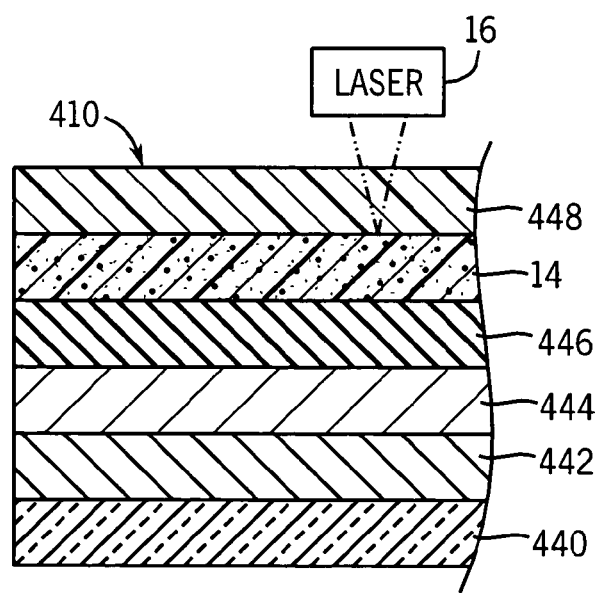
FIG. 8 is a fragmentary sectional view schematically illustrating a blank undergoing conductive patterning according to an example embodiment.
Figure 9:
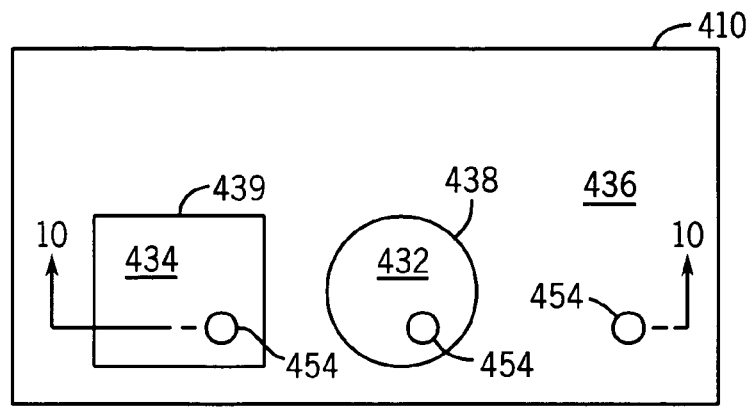
FIG. 9 is a top plan view of the blank of FIG. 8 illustrating electrically conductive zones formed in the blank according to one example embodiment.
Figure 10:
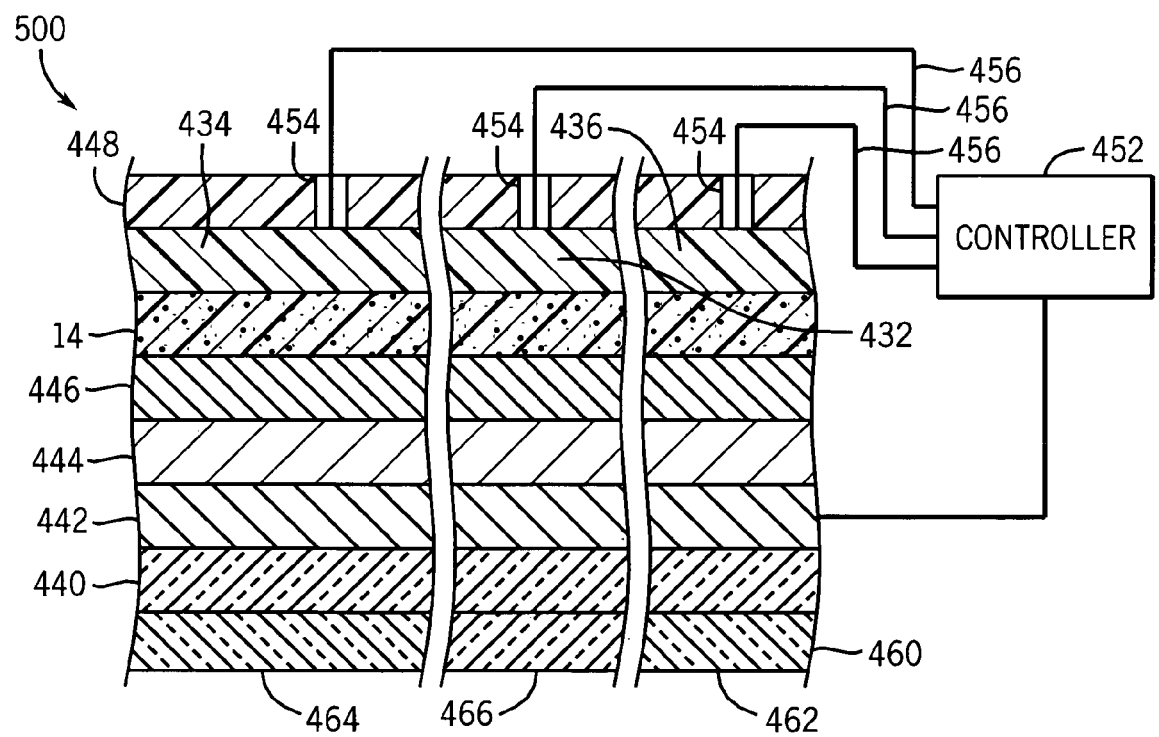
FIG. 10 is a sectional view of the blank of FIG. 9 taken along line 10-10 electrically connected to a controller to form an electronic device according to one example embodiment.

FIGS. 8-10 schematically illustrate steps for forming an electronic device 500 comprising an electroluminescent sign or display (shown in FIG. 10). As shown in FIG. 8, a blank 410 is initially fabricated or provided. Blank 410 includes substrate 440, electrode 442, electroluminescent material 444, dielectric 446, coating 14 and covering 448. Substrate 440 generally comprises a layer at least a portion of which is translucent so as to permit transmission of visual light. Substrate 440 further comprises a dielectric material upon which electrode 442 is formed. In one embodiment, substrate 440 may comprise a substantially and flexible material such as a clear polymer. In another embodiment, substrate 440 may comprise clear rigid material such as glass. In particular embodiments, substrate 440 may include colored materials so as to absorb certain wavelengths of light such that light passing through substrate 440 is filtered and also has a corresponding color.

Electrode 442 comprises a layer of transparent, electrically conductive material. The layer forming electrode 442 is positioned between substrate 440 and electroluminescent material 444. Electrode 442 creates an electrical field across electroluminescent material 444. In one embodiment, electrode 442 comprises a transparent mixed metal oxide such as indium tin oxide (ITO). In other embodiments, electrode 442 may comprise other materials such as carbon nanotubes, conductive polymers, transparent conductive or metal oxides such as ZnO, thin metal films such as silver metal alloys, and other transparent conductors such as zinc oxyfluoride, metal sulfide-metal-metal sulfide multilayers, conductive particle doped polymers, free standing conductive particle films, transparent hole conductors and the like.

Electroluminescent material 444 comprises a material configured to emit light in response to an applied electric field through or across the material. In one embodiment, electroluminescent material 444 comprises a layer of one or more phosphors. In other embodiments, material 444 may comprise a layer of other materials.

Dielectric 446 comprises a layer of dielectric material configured to electrically insulate electroluminescent material 444 from electrically conductive portions of coating 14. At the same time, dielectric material 446 has a thickness so as to not substantially interfere with the formation of an electrical field across electroluminescent material 444. In one embodiment, dielectric 446 comprises barium titanate having a thickness of between about 15 micrometers and 30 micrometers and nominally about 20 micrometers. In other embodiments, dielectric 446 may comprise other materials having other thicknesses.

Coating 14 is described above with respect to FIG. 1. As noted above, coating 14 is substantially non-conductive prior to being irradiated by a laser such from laser 16. Upon being irradiated, portions of coating 14 are converted to a conductive state. Such electrically conductive portions of coating 14 may be used to cooperate with electrode 442 to create an electric field across electroluminescent material 444 to excite electroluminescent material 444.

Covering 448 comprises a layer of material configured to overlie and protect coating 14. In one embodiment, covering 448 is laminated or otherwise secured over coating 14 prior to irradiation of coating 14 by laser 16. In such an embodiment, covering 448 is clear or substantially clear, allowing the laser beam emitted by laser 16 to pass through covering 448 and impinge upon coating 14. In other embodiments, cover 448 may be laminated or otherwise secured over coating 14 after coating 14 has been irradiated. In such an embodiment, covering 448 may be opaque or colored. In still other embodiments, covering 448 may be omitted.

As further shown by FIG. 8, laser 16 is actuated to irradiate coating 14 so as to convert zones of coating 14 from a non-conductive state to a conductive state. FIG. 9 illustrates zones 432, 434 and 436 that have been irradiated by laser 16 so as to attain an electrically conductive state. According to one embodiment, each of zones 432, 434 and 436 is formed by rastor scanning laser 16 across coating 14 so as to form multiple lines along such zones which are sufficiently close to one another such that portions between such lines are also electrically conductive. According to one embodiment, such lines are spaced from one another by less than or equal to about 25 microns. As further shown by FIG. 9, portions of coating 14 are not irradiated so as to separate zones 432, 434 and 436 from one another. In particular, lines or portions 438 and 439 are not radiated and separate zone 432 from zone 436 and zone 434 from zone 436, respectively. As a result, zone 432 of coating 14 is electrically isolated from zone 434 and 436. Likewise, zone 434 is electrically isolated from zones 432 and 436.

As shown by FIGS. 9 and 10, each zone 432, 434 and 436 is electrically connected to a driver or controller configured to selectively apply voltage to zones 432, 434 and 436 of coating 14 as well as electrode 442. In one embodiment where covering 448 is employed, openings 454 may be formed through covering 448 to facilitate an electrical connection with zones 432, 434 and 436. Such openings 454 may be formed by mechanical or chemical removal of portions of covering 448. In still other embodiments, electrical connection may be made with each of zones 432, 434 and 436 prior to application of covering 448, wherein covering 448 may be laminated or applied over electrical connects 456. In embodiments where one or more of zones 432, 434 and 436 are contiguous with a perimeter of blank 410, electrical connection to such zones may be made from a perimeter of blank 410. Although FIG. 9 illustrates three zones 432, 434 and 436, electronic device 500 may include a greater or fewer number of such zones.

As shown by FIG. 10, an overlay 460 is applied to substrate 440. Overlay 460 comprises one or more layers of translucent material which allow light emitted from electroluminescent layer 444 to pass through overlay 460. Overlay 460 may include colored portions which filter out light such that the resulting image is also colored. In one embodiment, overlay 460 includes overlay regions 462, 464 and 466 which substantially correspond to zones 432, 434 and 436, respectively. As a result, selective charging of zones 432, 434 and 436 by controller 452 may be used to selectively excite portions of electroluminescent material 444 to correspondingly selectively illuminate overlay regions 462, 464 and 466, respectively, creating an animated sign or display in which portions are sequentially illuminated.

Overall, coating 14 facilitates the fabrication of blank 410 in relatively large quantities. Such blanks 410 may then be irradiated with relatively low power inexpensive lasers 16 to form customized displays or signage. Because the patterning of electrically conductive portions is provided by an inexpensive laser, versus single use or customized screens or masks, patterning versatility is increased and fabrication costs are reduced.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. A method comprising:
irradiating portions of a non-conductive coating having conductive elements, a binder to join the conductive elements, and a material to propagate absorption of radiation from a light source to induce the portions to an electrical conducting state, wherein irradiating the portions liquefies the binder to create the electrical conducting state at the portions, wherein irradiating the portions liquefies the binder at the portions to allow the conductive elements to move into electrically conductive positions relative to one another.

2. The method of claim 1, wherein the irradiating is performed with a laser at a power of less than or equal to 50 milliwatts.

3. The method of claim 2, wherein the laser has a wavelength of less than about 800 nanometers.

4. The method of claim 1 further comprising altering a color of the portions irradiated.

5. The method of claim 1, wherein the conductive elements include a metal salt having metal elements and wherein irradiating the portions substantially reduces the metal salt to metal particles.

6. The method of claim 1, wherein the portions include multiple lines spaced less than or equal to 25 microns.

7. The method of claim 1, wherein the material in the portions is substantially vaporized during irradiation of the portions.

8. The method of claim 1, wherein the material is a laser sensitive dye.

9. The method of claim 8, wherein the coating includes by mass between about 6% and about 18% of the dye.

10. The method of claim 1, wherein the portions, after being irradiated, have a sheet resistivity of less than or equal to about 10 ohms/square.

11. The method of claim 10, wherein non-irradiated portions have a sheet resistivity of at least about 100 ohms/square.

12. The method of claim 1, wherein the portions form an antenna for a radio frequency identification tag.

13. The method of claim 1 further comprising creating an electric field between the portion and another conductive surface opposite the portion.

14. The method of claim 1 further comprising creating an electric field between the portion and another conductive surface opposite the portion to excite an electroluminescent material within the field.

15. The method of claim 1 further comprising mounting a cartridge including a laser to a carriage of a printer.

16. The method of claim 1, wherein the coating is configured to change color upon being irradiated by a laser.

17. The method of claim 1, wherein the material comprises a dye of sufficient quantity such that the coating has a sheet of resistivity of at least about 100 ohms/square.

18. The method of claim 1, wherein the coating overlies a transparent substrate, a transparent conductor layer and an electroluminescent material layer between the transparent conductor layer and the coating.

19. The method of claim 18, wherein a dielectric layer extends between the electroluminescent material layer and the coating.

20. The method of claim 3, wherein the electroluminescent material comprises a phosphor.

21. The method of claim 18, wherein a translucent layer extends over the substrate.

22. The method of claim 1, wherein the portions form an antennae that is connected to an integrated circuit configured to transmit signals via the antenna.

* * * * *

UNITED STATES PATENT AND TRADEMARK OFFICE
CERTIFICATE OF CORRECTION

| | | |
|---|---|---|
| PATENT NO. | : 7,569,331 B2 | Page 1 of 1 |
| APPLICATION NO. | : 11/142699 | |
| DATED | : August 4, 2009 | |
| INVENTOR(S) | : Dorogy et al. | |

It is certified that error appears in the above-identified patent and that said Letters Patent is hereby corrected as shown below:

In column 1, line 54, delete "disclose" and insert -- disclosure, the --, therefor.

In column 8, lines 25-26, delete "into a 2 micrometer diameter spot." and insert -- of optical output power at a 780 nanometer --, therefor.

In column 14, line 31, in Claim 20, delete "claim 3," and insert -- claim 18, --, therefor.

Signed and Sealed this
Third Day of May, 2011

David J. Kappos
*Director of the United States Patent and Trademark Office*